United States Patent
Huang et al.

(10) Patent No.: US 8,866,507 B2
(45) Date of Patent: Oct. 21, 2014

(54) METHOD FOR TESTING TRAP DENSITY OF GATE DIELECTRIC LAYER IN SEMICONDUCTOR DEVICE HAVING NO SUBSTRATE CONTACT

(75) Inventors: Ru Huang, Beijing (CN); Jibin Zou, Beijing (CN); Runsheng Wang, Beijing (CN); Jiewen Fan, Beijing (CN); Changze Liu, Beijing (CN); Yangyuan Wang, Beijing (CN)

(73) Assignee: Peking University, Beijing (CN)

( * ) Notice: Subject to any disclaimer, the term of this patent is extended or adjusted under 35 U.S.C. 154(b) by 338 days.

(21) Appl. No.: 13/382,415

(22) PCT Filed: Sep. 29, 2011

(86) PCT No.: PCT/CN2011/080334
§ 371 (c)(1),
(2), (4) Date: Jan. 5, 2012

(87) PCT Pub. No.: WO2012/058995
PCT Pub. Date: May 10, 2012

(65) Prior Publication Data
US 2012/0187976 A1   Jul. 26, 2012

(30) Foreign Application Priority Data
Nov. 2, 2010  (CN) .......................... 2010 1 0528764

(51) Int. Cl.
  *G01R 31/02* (2006.01)
  *H01L 21/66* (2006.01)
  *G01R 31/26* (2014.01)
(52) U.S. Cl.
  CPC ............ *H01L 22/14* (2013.01); *G01R 31/2621* (2013.01); *G01R 31/2642* (2013.01)
  USPC ............ 324/762.01; 324/762.08; 324/762.09; 324/762.1; 324/760.02; 324/762.05

(58) Field of Classification Search
  USPC ............... 324/762.01, 762.08, 762.09, 762.1, 324/760.02, 762.05
  See application file for complete search history.

(56) References Cited

U.S. PATENT DOCUMENTS

| | | | | |
|---|---|---|---|---|
| 5,519,334 | A  * | 5/1996  | Dawson ................... | 324/754.23 |
| 6,391,668 | B1   | 5/2002  | Chacon et al. | |
| 6,838,869 | B1 * | 1/2005  | Rogers et al. ............ | 324/762.01 |
| 8,604,409 | B2 * | 12/2013 | Yan et al. .................. | 250/214.1 |
| 2007/0152673 | A1 | 7/2007 | Song | |
| 2007/0213954 | A1 | 9/2007 | Price | |
| 2007/0236237 | A1* | 10/2007 | Kuo et al. ...................... | 324/765 |
| 2009/0082978 | A1* | 3/2009 | Yang et al. ..................... | 702/58 |
| 2009/0309624 | A1* | 12/2009 | Song ............................. | 324/765 |

FOREIGN PATENT DOCUMENTS

| | | |
|---|---|---|
| CN | 102053114 A | 5/2011 |
| JP | H0276234 A | 3/1990 |
| WO | WO-2007/103933 A1 | 9/2007 |

OTHER PUBLICATIONS

Liu Hong-Xia et al. "A method for measuring the density of trapping charges in thin gate oxides." Acta Physica Sinica. vol. 51, No. 1, Jan. 2002.
Dongming Liu et al., A Novel Experimental Method to Measure Interface Trap Density in Gate-Drain Overlap Region, IEEE, Dec. 18, 2003, 205-208.
K. Nomoto et al., Analytical model of the programming characteristics of scaled MONOS memories with a variety of trap densities and a proposal of a trap-density-modulated MONS memory, IEEE, Dec. 5, 2001, 13.5.1-13.5.4.
International Search Report (in Chinese) and Written Opinion (in Chinese) for PCT/CN2011/080334, mailed Jan. 5, 2012; ISA/CN.

* cited by examiner

*Primary Examiner* — Huy Q Phan
*Assistant Examiner* — Temilade S Rhodes-Vivour
(74) *Attorney, Agent, or Firm* — Harness, Dickey & Pierce, P.L.C.

(57) ABSTRACT

A method for testing trap density in a gate dielectric layer of a semiconductor device having no substrate contact is provided in the invention. A source and a drain of the device are bilateral symmetric, and probes and cables of a test instrument connecting to the source and the drain are bilateral symmetric. Firstly, bias settings at the gate, the source and the drain are controlled so that the device is under an initial state that an inversion layer is not formed and traps in the gate dielectric layer impose no confining effects on charges. After that, the following steps are repeated sequentially to form a loop by changing the bias settings: 1) carriers flow into the channel through the source and the drain to form an inversion layer, and a portion of carriers are confined by the traps in the gate dielectric layer; 2) carriers of the inversion layer flow back to the source and the drain respectively, whereas the carriers confined by the traps in the gate dielectric layer do not flow back to the channel; 3) carriers confined by the traps in the gate dielectric layer flow out through the drain terminal only; and the trap density of the gate dielectric layer are calculated according to the period of the loop, the size of the channel of the device, and DC currents at the source and the drain. The method is simple and effective and is easy to setup the instruments with a low cost. The method is applicable to be used in testing traps in the gate dielectric layer of the devices that have no substrate contact, especially the surrounding-gate device.

7 Claims, 4 Drawing Sheets

METHOD FOR TESTING TRAP DENSITY OF GATE DIELECTRIC LAYER IN SEMICONDUCTOR DEVICE HAVING NO SUBSTRATE CONTACT

CROSS-REFERENCE TO RELATED APPLICATIONS

This application is a 371 U.S. National Stage of International Application No. PCT/CN2011/080334, filed Sep. 29, 2011, and claims priority to Chinese patent application No. 201010528764.X filed Nov. 2, 2010, the disclosures of which are herein incorporated by reference in their entirety.

FIELD OF THE INVENTION

The present invention relates to a method for testing reliability of a semiconductor device, more particularly, relates to a method for testing trap density of a gate dielectric layer in a semiconductor device having no substrate contact (e.g., a surrounding-gate device).

BACKGROUND OF THE INVENTION

Semiconductor devices are essential elements for producing electronic products. Updates of the semiconductor devices have been a driving force for the development of semiconductor technologies and the progress of the semiconductor industry, especially for the elevation of the performance of Central Processing Units (CPU) and memories. Since the end of the last century, the process for manufacturing chips have been developed very rapidly, the level of which has been evolved from micrometers to a technology under 32 nm now.

Under a circumstance that photolithography technologies have a limitation to be improved further and advanced photolithography technologies are impossible to be used to obtain a mass production, the implementation of continually reducing patterns to a minimum would imply a constant increase of the cost and a decrease of the yield. At present, taking an example of a 45 nm planar transistor process, which has reached to the process limitation, a serious short-channel effect is introduced, thus causing a raise of an off-state current and a lowering of a transconductance, etc. Improving the gate control capability of a semiconductor device has become a current research focus, where a surrounding-gate device is one of the important devices for obtaining excellent gate control capability and alleviating the short-channel effect.

Meanwhile, when a new manufacturing process is to be put into use, tests for the reliability of the gate dielectric of a semiconductor device manufactured by such process is also a very important subject. Since electron traps and hole traps in the gate dielectric layer of the semiconductor device, i.e. certain dangling bonds or defects, would cause a drift of a threshold voltage of the device and a decrease of an on-state current, thus resulting in a serious negative/positive bias temperature instability (NBTI/PBTI), and at the same time would cause an increase of a gate-drain current to shrink the reliability and the life of the device. Researches and tests for the traps in the dielectric layer may provide an optimal solution for manufacturing the device, and tests of the reliability for traps is in turn an important way for characterizing the life span.

A relatively precise method for testing traps for conventional planar transistor devices is a charge pump test, in which the device is required to have substrate contact for signals. However, in novel devices such as a surrounding-gate device, contacts only exist at three terminals, i.e. the gate, the source and the drain terminal, therefore, it is impossible to apply the typical charge pump test to the semiconductor device having no substrate contact. At present, for the surrounding-gate device, a test for traps in its three-dimensional surrounded type gate dielectric has become a focus question in manufacturing integrated circuits.

SUMMARY OF THE INVENTION

A purpose of the invention is to fill a technology blank in the prior art, and provide a simple and effective method for testing traps in a gate dielectric for a semiconductor device having no substrate contact.

A technical solution of the invention is as follows.

A method for testing a trap density of a gate dielectric layer in a semiconductor device having no substrate contact is provided, wherein a source and a drain terminal of the semiconductor device form a bilateral symmetric structure with respect to a central line of a channel, and probes of a semiconductor parameter test instrument are connected to the gate, the source and the drain terminal of the device respectively, wherein the probes and cable connection lines used to connect the test instrument with the source and the drain terminal are bilateral symmetric with each other as well (that is, the pair of probes and cable connection lines have the same length and are symmetric with each other in shape and structure); firstly, bias settings at the gate, the source and the drain terminal of the device are controlled so that the device is under an initial state that an inversion layer is not formed and traps in the gate dielectric layer impose no confining effects on charges; after that, the following steps 1), 2) and 3) are repeated sequentially to form a loop and DC currents are measured at the source and the drain terminal:

1) Changing the bias settings and holding for a period of T1, so that majority carriers are entered into the channel through the source and the drain terminal to form an inversion layer in the channel, and a portion of carriers in the inversion layer are confined by the traps in the gate dielectric layer;

2) Changing the bias settings and holding for a period of T2, so that carriers in the inversion layer flow back to the source and the drain terminal respectively, whereas the carriers confined by the traps in the gate dielectric layer do not flow back to the channel;

3) Changing the bias settings and holding for a period of T3, so that the carriers confined by the traps in the gate dielectric layer flow out through the drain terminal only; and Finally, the trap density Qt of the gate dielectric layer is calculated by the following equation:

$$Qt = \frac{(|Id| + |Is|)}{qFWL}$$

Wherein, Is is the DC current at the source terminal; Id is the DC current at the drain terminal; W is a channel width of the device; L is a channel length of the device; q is electrical quantity of charges per unit, and $q=1.62\times10^{-19}$ coulombs; and F is a cycle frequency of the loop, and $F=1/(T1+T2+T3)$.

Preferably, in the above-mentioned method, in the initial state, the bias setting at the gate, the source and the drain terminal are Vg0, Vs0 and Vd1 respectively, wherein Vg0=Vs0, Vg0 and Vs0 are in a range from 0 to 0.1×VDD; and Vd1 is in a range from 0.5×VDD to 0.75×VDD, wherein VDD is an on-state operation voltage of the device.

Preferably, in the step 1), T1=50-100 µs; the bias setting at the gate, the source and the drain terminal are Vg1, Vs0 and Vd0 respectively, wherein Vg1 is in a range from 0.9×VDD to VDD, Vs0=Vd0, Vs0 and Vd0 are in a range from 0 to 0.1×VDD, and Vd0 is equal to Vg0 set in the initial state, wherein VDD is the on-state operation voltage of the device.

Preferably, in the step 2), T2 is in a range from 5-10 µs; the bias setting at the gate, the source and the drain terminal are Vg0, Vsx and Vdx respectively, wherein Vg0<Vsx, 0<Vsx<0.1×VDD, and Vdx=Vsx.

Preferably, in the step 3), T3=100-200 µs; the bias setting at the gate, the source and the drain terminal are Vg0, Vs0 and Vd1 respectively, wherein Vg0=Vs0=0-0.1×VDD; and Vd1=(0.5-0.75)×VDD.

The method for testing trap density of a gate dielectric layer in a semiconductor device having no substrate contact according to the present invention, can easily and effectively test the quality of the gate dielectric of the device, to obtain a distribution of the traps in the gate dielectric for various different materials and processes. In a method according to the invention, it is easy to setup test instruments, and the device under test is not tended to be damaged, thus the cost for test is low. Also, test can be rapidly performed, which means the distribution of the traps in the gate dielectric of the device can be obtained in a short time, so that the method is applicable to mass automatic tests. Further, the operation of the method according to the invention is compatible with the typical reliability test (the charge pump), hence, it is easy to be operated and it is suitable for being used in a process monitoring and a detection of the product quality during manufacturing the new generation of the surrounding-gate devices. Moreover, it is also applicable to other devices that have no substrate contact.

BRIEF DESCRIPTION OF THE DRAWINGS

In FIG. 1-FIG. 4:
1—a device under test; 2—a test instrument; 3—a cable and a probe contacting a source terminal; 4—a cable and a probe contacting a drain terminal; 101—the source terminal; 102—the drain terminal; 103—a channel; 104—a gate dielectric layer; 105—a gate; 106—a symmetric central line; 107—traps in the gate dielectric layer; 108—carriers provided from the source terminal and confined by traps in the gate dielectric layer adjacent to the source terminal; 109—carriers provided from the drain terminal and confined by traps in the gate dielectric layer adjacent to the drain terminal; 110—an inversion layer formed by majority carriers at the source terminal; 111—an inversion layer formed by majority carriers at the drain terminal; 112—a conduction band; 113—a valence band; and 114—a flowing direction of electrons.

In FIG. 5: 501—Vg1; 502—Vg0; 503—Vd1; 504—Vd0; 505—Vdx; 506—Vs0; 507—Vsx; 508—+Q1+Q2 (similarly, hereinafter, "+" indicates flowing into a terminal, and "−" indicates flowing out from the terminal); 509—−Q2; 510—+Q3+Q4; 511—−Q4; 512—−Q1-Q3.

DETAILED DESCRIPTION OF THE EMBODIMENTS

A detail description of the prevent invention will be given by taking a device having a surrounding-gate structure as an example, however, it should be understood by those skilled in the art of field that a method for testing traps in a gate dielectric is equally applicable to other devices having no substrate contact.

Figure 1:
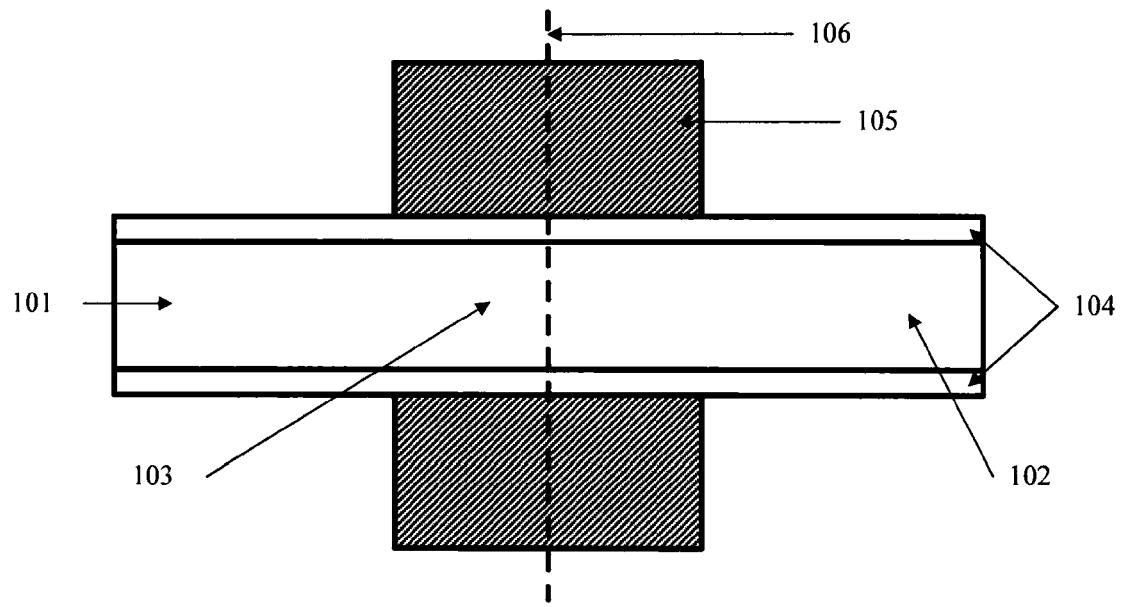
FIG. 1 is a cross-sectional view of a surrounding-gate device under test according to an embodiment of the invention.
Figure 2:
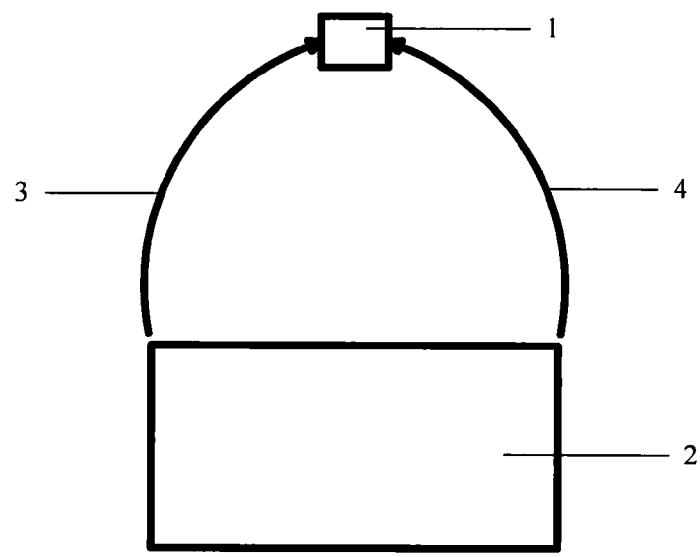
FIG. 2 is a schematic view showing a connection relationship between a semiconductor parameter test instrument and the device.

A cross-sectional view of a surrounding-gate device is as shown in FIG. 1, in which a source terminal 101 and a drain terminal 102 of the device forms a bilateral symmetric structure with respect to a central line 106a at which a channel 103 is bisected, and a surrounded-type gate 105 is isolated from the source terminal 101, the drain terminal 102 and the channel 103 by a gate dielectric layer 104. Three test probes of a semiconductor parameter test instrument 2 are connected to the gate, the source and the drain terminal of the surrounding-gate device 1 respectively, wherein lengths and formations of the two probes connecting to the source and the drain terminal as well as cable connection lines 3 and 4 are kept bilateral symmetric, as shown in FIG. 2. A test for trap density of the gate dielectric layer in the surrounding-gate device is performed as the following steps.

1) Initial State

Figure 5:
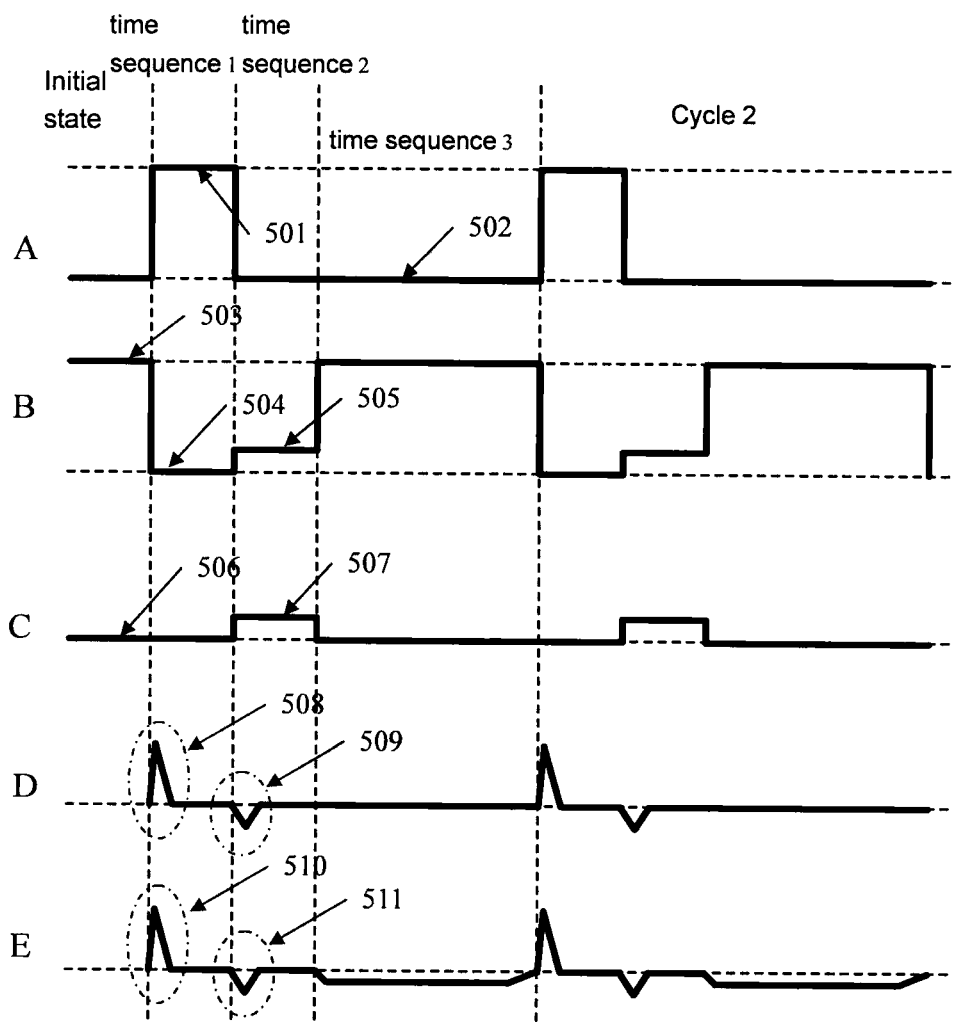
FIG. 5 is a logic view showing voltages applied to the gate, the source and the drain terminal of the device according to an embodiment, and is a schematic view showing corresponding current outputs at these three terminals, wherein A is a timing diagram under a gate voltage bias; B is a timing diagram under a drain voltage bias; C is a timing diagram under drain and source voltage biases; D is a schematic timing diagram of a source terminal current Is; and E is a schematic timing diagram of a drain terminal current Id.

After connecting a probe A, B and C to the gate, the source and the drain terminal of the surrounding-gate device respectively, biases at the probe A, B and C are set to Vg0, Vs0 and Vd1, as the bias settings during the initial state indicated in FIG. 5.

It is required that lengths and shapes of the cable connection lines of the probe B and C are kept symmetric, and the test instrument with respect to the center of the surrounding-gate device should be symmetric as well.

Figure 3A:
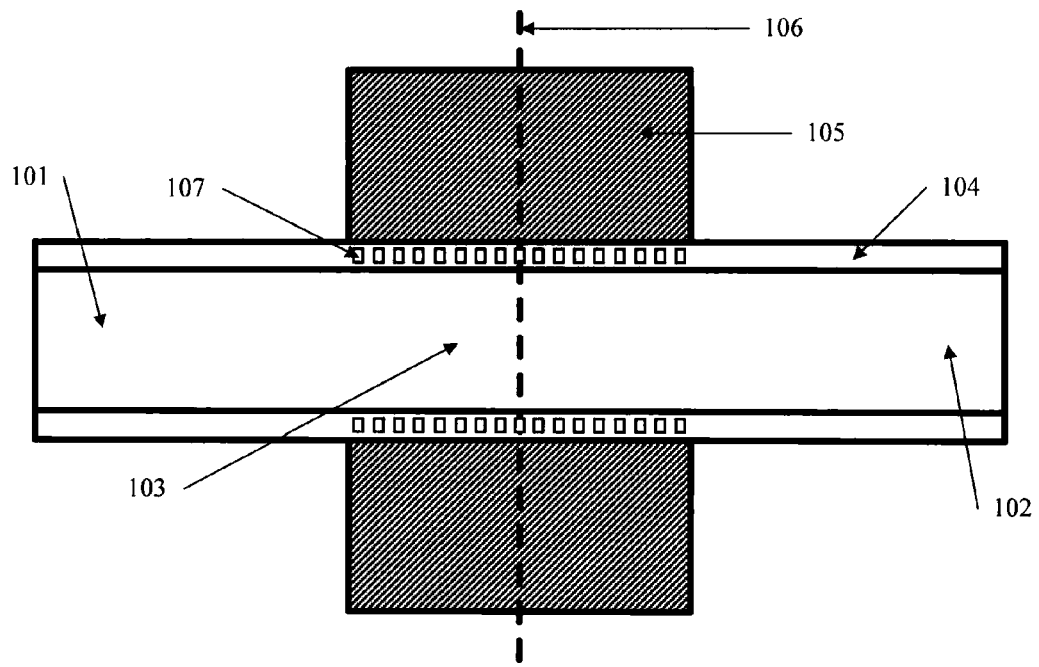
FIG. 3a is a schematic view showing a state of the cross section of the surrounding-gate device, in an initial state before testing according to an embodiment.

Here, Vg0 and Vs0 may be a ground signal, i.e. zero bias, or may be an off-state operation voltage VSS of the surrounding-gate device while ensuring Vg0=Vs0; Vd1 may have a value that is larger than a half of an on-state operation voltage of the device, e.g. ⅔ VDD. At this time an internal state of the device is illustrated in FIG. 3a, in which a region of the channel 103 is not formed as an inversion layer; and in the gate dielectric layer 104 most of charge traps are emptied, that is, majority carriers in the drain and the source terminal are not captured by traps 107 in the gate dielectric layer.

(2) During a Time Sequence 1

By way of an automatic control of the instrument, voltages at ports of the probes A and C are simultaneously changed to Vg1 and Vd0, while a voltage at the port of the probe B is kept unchanged, as indicated by the bias settings of the time sequence 1 in FIG. 5.

Vg1 may be VDD, and Vd0 may be the off-state operation voltage VSS of the surrounding-gate device or a zero bias while Vd0 is equal to Vg0. At this time, carriers inside the device form an inversion layer. After a very short period elapses, the carriers are captured by traps in the gate dielectric layer under an electric field.

Here, the carriers in the inversion layer come from the source and the drain terminal, i.e. the probes B and C. Since the paths from the test instrument to the probe B and C are designed to be strictly symmetric during the initial state, half of the carriers in the inversion layer comes from the source terminal, i.e. the probe B, whereas the other half comes from the drain terminal, i.e. the probe C. Due to properties of the electron/hole traps, it is considered that carriers 108, which are filled in the traps at the source terminal side under a vertical electric field generated from the gate voltage Vg1, come from the inversion layer provided at the source terminal, and carriers 109 which are filled in the traps at the drain terminal side come from the inversion layer provided at the drain terminal. Electrical quantities of these two charge portions trapped by the traps are Q1 and Q3 respectively. Due to the symmetric characteristic, it may be considered that Q1≈Q3, as shown in FIG. 3b.

Figure 3B:
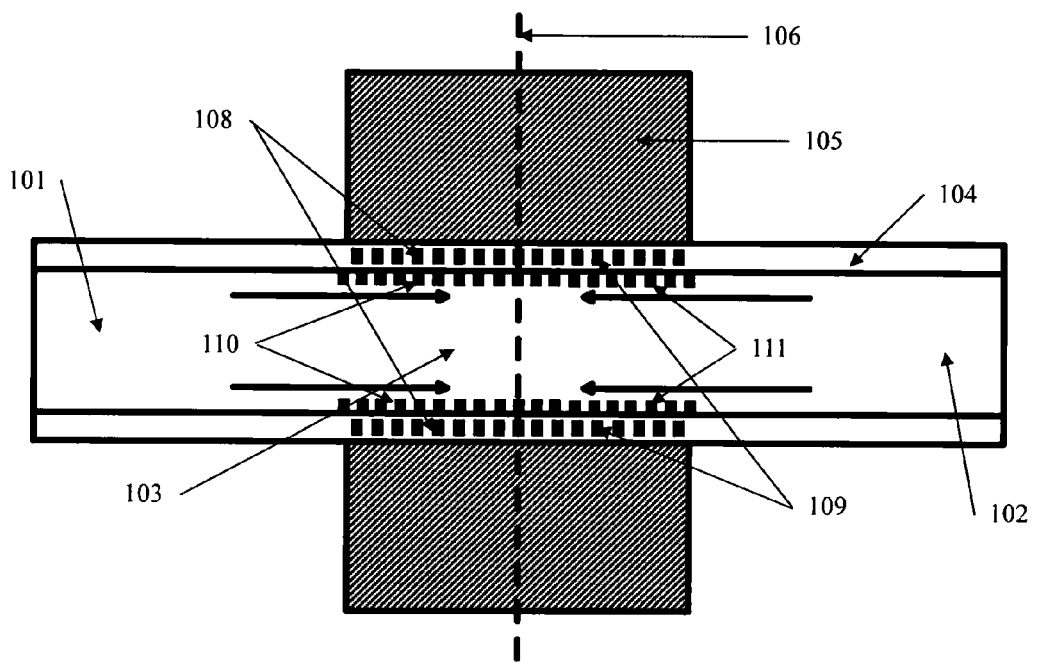
FIG. 3b is a schematic view showing a flowing direction of electrons in the device during a test time sequence 1 according to an embodiment.

The time sequence 1 lasts for a period of T1, where T1 is associated with the material and thickness of the gate dielectric layer 104 as well as the length of the channel 103, and T1 is about 50-100 μs, to obtain a state as illustrated in FIG. 3b, in which a region of an accumulation layer is stable, electrical quantity of charges for the portion provided by the source terminal 101 (i.e., the inversion layer 110 formed by the majority carriers at the source terminal) is Q2, and electrical quantity of charges for the portion provided by the drain terminal 102 (i.e., the inversion layer 111 formed by the majority carriers at the drain terminal) is Q4. Due to the symmetric characteristic, it may be considered that Q2≈Q4, as shown in FIG. 3b.

(3) During a Time Sequence 2

By way of an automatic control of the instrument, voltages at ports of the probes A, B and C are simultaneously changed to Vg0, Vsx and Vdx while ensuring that Vg0<Vsx=Vdx<0.1×VDD, as indicated by the bias settings at the time sequence 3 in FIG. 5.

Figure 3C:
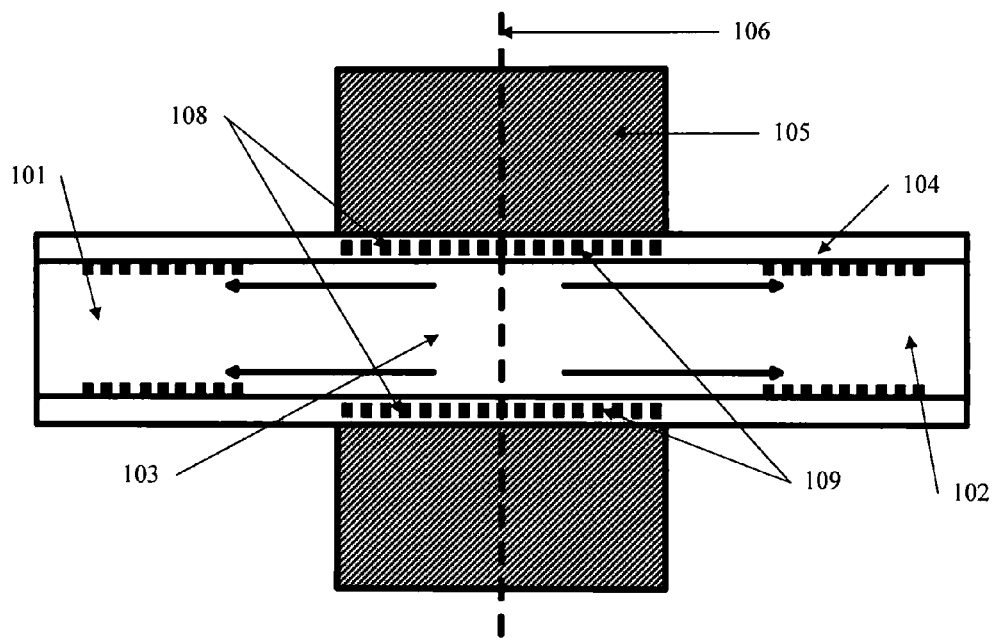
FIG. 3c is a schematic view showing a flowing direction of electrons in the device during a test time sequence 2 according to an embodiment.

At this time, the charges Q2 and Q4 in the inversion layers 110 and 111 are extracted backwards to the source terminal 101 and the drain terminal 102 under the force of Vg0, Vsx and Vdx. The time sequence 2 is very short and is about 5-10 μs. Since charge carriers Q1 and Q3 have no trend to form strong electric fields, there is no enough time for them to be escaped from their confined state, thus remaining in the traps. The time sequence 2 is dependent on the size of the surrounding-gate device and the turn-on voltage VDD. Distributions and moving trends of the carriers in the inversion layer and the carriers confined by the traps in the surrounding-gate device are illustrated in FIG. 3c.

(4) During a Time Sequence 3

Figure 3D:
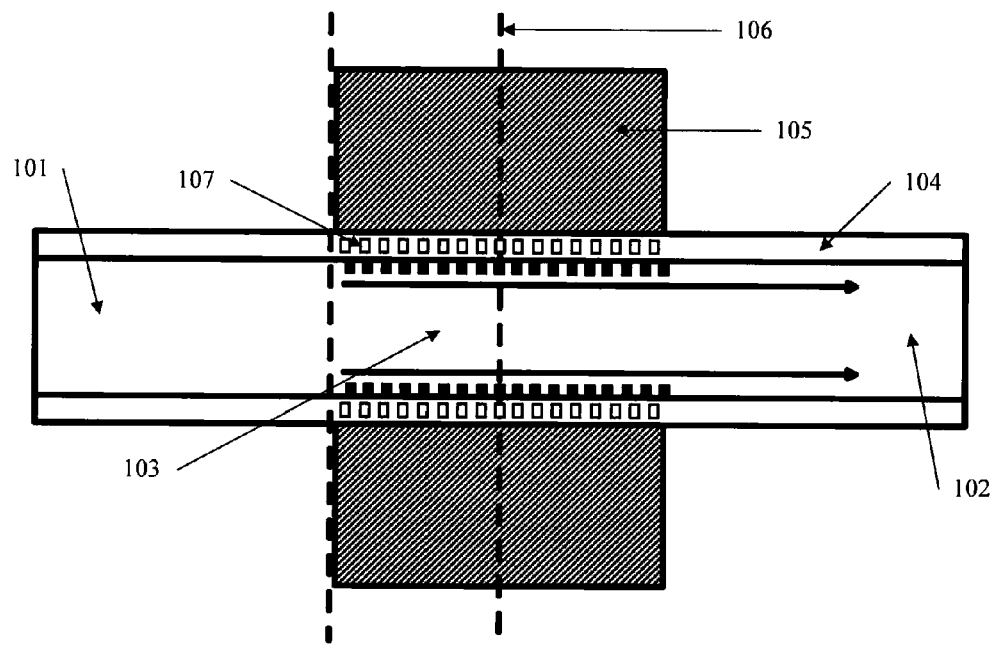
FIG. 3d is a schematic view showing a flowing direction of electrons in the device during a test time sequence 3 according to an embodiment.

By way of an automatic control of the instrument, voltages at ports of the probes A, B and C are simultaneously changed to Vg0, Vd1 and Vs0, where the specific voltage settings are the same as that in the initial state. At this time, under Vd1, the carriers confined by the traps in the gate dielectric layer jump from their confined states, enter into the channel 103 to form free carriers in the channel, and return to the drain terminal 102 under the drain and terminal voltages, where the electrical quantity of charges for this portion of carriers is Q1+Q3. As shown in FIG. 3d, such process lasts for a certain period of T3, which is about 100-200 μs and is dependent on the size of the surrounding-gate device and the material of the dielectric layer.

Figure 4:
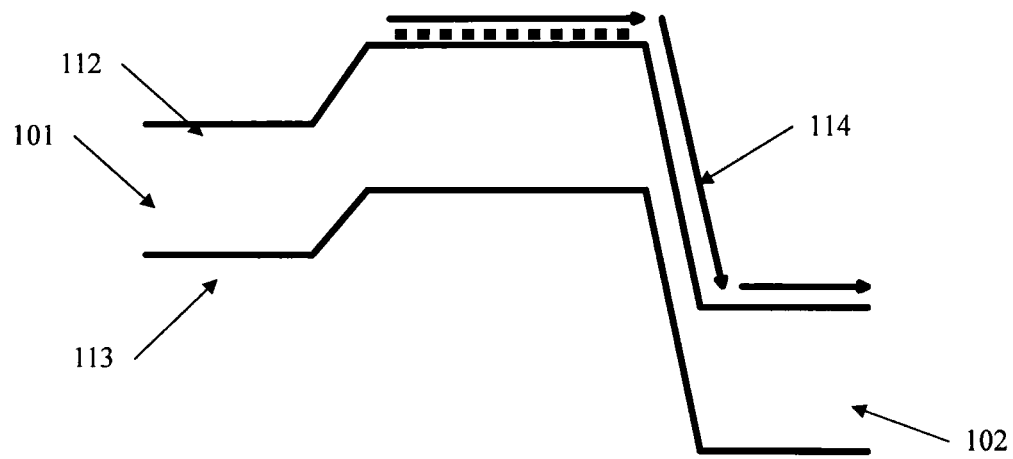
FIG. 4 is a schematic view showing energy bands and a flowing direction of electrons in an N-type surrounding-gate device during a test time sequence 3 according to an embodiment.

FIG. 4 shows a structure of energy bands (a conduction band 112 and a valence band 113) and a moving trend that the carriers confined by the traps escape form the control of the traps afterwards. It is assumed that in FIG. 4 the surrounding-gate device is an N-type device and the majority carriers are electrons, however, the present invention is not limited to the N-type device.

5) After the time sequence 3 is completed, the time sequences 1, 2 and 3 are repeated by an automatic control of the instrument so as to form loops, at the same time DC current outputs at the probe B, C are recorded, that is, the obtained AC currents are averaged within a relatively large range of time (e.g., 500 μs).

As such, in a cycle constituted of the time sequences 1, 2 and 3, the number of the majority carriers flowing through the source terminal (the probe B) is as follows: (noted that, "+" indicates flowing in, and "−" indicates flowing out)

| +Q1 +Q2 | −Q2 | 0 | +Q1 |
|---|---|---|---|
| Time Sequence 1 | Time Sequence 2 | Time Sequence 3 | One Cycle |

The number of the majority carriers flowing through the drain terminal (the probe C) is as follows:

| +Q3 +Q4 | −Q4 | −Q1 −Q3 | −Q1 |
|---|---|---|---|
| Time Sequence 1 | Time Sequence 2 | Time Sequence 3 | One Cycle |

Hence, during one cycle, a net quantity of charges that is able to be monitored by the drain/source terminals is Q1.

After forming a plurality of cycles as above, an averaged DC current value can be obtained from the drain/source terminal, which can be expressed as the following equation:

$$|Is|=|Id|=|q \times Q1 \times F|$$

$$F=1/(T1+T2+T3)$$

Where, Is is a DC current at the source terminal, Id is a DC current at the drain terminal, Q1 is the number of the carriers provided from the source terminal and confined by half of the traps in the gate dielectric layer of the surrounding-gate device, F is a cycle frequency and q is the electrical quantity of charges per unit, in which q=1.62×10$^{-19}$ coulombs. If it is assumed that the trap density of the dielectric layer per unit is Qt, then by way of monitoring T1, T2, T3, Is and Id and by using the known parameters, i.e. a width W of the channel of the surrounding-gate device, a length L of the channel of the surrounding-gate device and the constant q, Qt can be expressed as follows:

$$Qt = \frac{(|Id|+|Is|)}{qFWL}$$

Where, absolute values of Id and Is are averaged for the purpose of removing errors during parameter extractions.

The above-mentioned embodiments set forth a method for testing trap density in a gate dielectric layer of a surrounding-gate device. The method is also applicable to other semiconductor devices that have no substrate contact, such as a ultra thin bulk SOI device (UTBSOI).

What is claimed is:

1. A method for testing trap density of a gate dielectric layer in a semiconductor device having no substrate contact, wherein a source and a drain terminal of the semiconductor device form a bilateral symmetry structure with respect to a central line of a channel, and probes of a semiconductor parameter test instrument are connected to the gate, the source and the drain terminal of the semiconductor device respectively, and the probes and cable connection lines of the semiconductor parameter test instrument used to connect the test instrument with the source and the drain terminal are bilateral symmetric with each other; firstly, bias settings at the gate, the source and the drain terminal are controlled so that the semiconductor device is under an initial state that an inversion layer is not formed and traps in the gate dielectric layer impose no confining effects on charges; after that, the following steps 1), 2) and 3) are repeated sequentially to form a loop and DC currents are measured at the source and the drain terminal:

1) changing the bias settings and holding for a period of T1, so that majority carriers are entered into the channel through the source and the drain terminal to form an inversion layer in the channel, and a portion of carriers of the inversion layer are confined by the traps in the gate dielectric layer;
2) changing the bias settings and holding for a period of T2, so that carriers of the inversion layer flow back to the source and the drain terminal respectively, whereas carriers confined by the traps in the gate dielectric layer do not flow back to the channel;
3) changing the bias settings and holding for a period of T3, so that the carriers confined by the traps in the gate dielectric layer flow out through the drain terminal only; and finally, trap density Qt of the gate dielectric layer is calculated by the following equation:

$$Qt = \frac{(|Id| + |Is|)}{qFWL}$$

wherein, Is is DC current at the source terminal; Id is DC current at the drain terminal; W is a channel width of the semiconductor device; L is a channel length of the semiconductor device; q is electrical quantity of charges per unit, and $q=1.62\times10^{-19}$ coulombs; and F is a cycle frequency of the loop, and $F=1/(T1+T2+T3)$, wherein, in the initial state, the bias settings at the gate, the source and the drain terminal are Vg0, Vs0 and Vd1 respectively, wherein Vg0=Vs0; Vg0 and Vs0 are in a range from 0 to 0.1×VDD; and Vd1 is in a range from 0.5×VDD to 0.75×VDD, wherein VDD is an on-state operation voltage of the semiconductor device.

2. The method according to claim 1, characterized in that, in the step 1), the bias settings at the gate, the source and the drain terminal are Vg1, Vs0 and Vd0 respectively, wherein Vg1 is in a range from 0.9×VDD to VDD; Vs0=Vd0; Vs0 and Vd0 are in a range from 0 to 0.1×VDD; and Vd0 is equal to Vg0 set in the initial state, wherein VDD is an on-state operation voltage of the semiconductor device.

3. The method according to claim 1, characterized in that, in the step 2), the bias settings at the gate, the source and the drain terminal are Vg0, Vsx and Vdx respectively, wherein Vg0<Vsx, 0<Vsx<0.1×VDD, and Vdx=Vsx, wherein VDD is an on-state operation voltage of the semiconductor device.

4. The method according to claim 1, characterized in that, in the step 3), the bias settings at the gate, the source and the drain terminal are Vg0, Vs0 and Vd1 respectively, wherein Vg0=Vs0; Vg0 and Vs0 are in a range from 0 to 0.1×VDD; and Vd1 is in a range from 0.5×VDD to 0.75×VDD, wherein VDD is an on-state operation voltage of the semiconductor device.

5. The method according to claim 1, characterized in that, in the step 1), T1 is in a range from 50-100 μs.

6. The method according to claim 1, characterized in that, in the step 2), T2 is in a range from 5-10 μs.

7. The method according to claim 1, characterized in that, in the step 3), T3 is in a range from 100-200 μs.

* * * * *